(12) United States Patent
Mochizuki

(10) Patent No.: US 6,724,599 B2
(45) Date of Patent: Apr. 20, 2004

(54) POWER SEMICONDUCTOR DEVICE

(75) Inventor: Kouichi Mochizuki, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 38 days.

(21) Appl. No.: 09/986,594

(22) Filed: Nov. 9, 2001

(65) Prior Publication Data

US 2002/0190325 A1 Dec. 19, 2002

(30) Foreign Application Priority Data

Jun. 19, 2001 (JP) ........................................ 2001-184943

(51) Int. Cl.$^7$ ................................................. H02H 9/08
(52) U.S. Cl. ...................... 361/93.9; 361/764; 361/783; 361/820; 363/95; 363/97; 363/98; 318/439; 318/254; 318/138
(58) Field of Search ................................ 361/820, 828, 361/832, 837, 764, 783, 93.9; 357/27; 363/95, 97, 98; 318/254, 439, 138

(56) References Cited

U.S. PATENT DOCUMENTS

| | | | | |
|---|---|---|---|---|
| 5,023,684 A | * | 6/1991 | Tsunoda | 257/423 |
| 5,291,065 A | * | 3/1994 | Arai et al. | 257/723 |
| 5,306,949 A | * | 4/1994 | Yamada et al. | 257/690 |
| 5,347,158 A | * | 9/1994 | Matsuda et al. | 257/691 |
| 5,616,955 A | * | 4/1997 | Yamada et al. | 257/690 |
| 5,825,641 A | * | 10/1998 | Mangtani | 363/98 |
| 5,920,119 A | * | 7/1999 | Tamba et al. | 257/718 |
| 6,104,149 A | | 8/2000 | Pelly | |
| 6,320,775 B1 | * | 11/2001 | Ito et al. | 363/132 |

FOREIGN PATENT DOCUMENTS

| | | |
|---|---|---|
| EP | 0 431 586 | 6/1991 |
| JP | 10-285954 | 10/1998 |
| JP | 11-265974 | 9/1999 |
| JP | 2000-171491 | 6/2000 |

* cited by examiner

*Primary Examiner*—David Martin
*Assistant Examiner*—Thanh Yen Tran
(74) *Attorney, Agent, or Firm*—Oblon, Spivak, McClelland, Maier & Neustadt, P.C.

(57) ABSTRACT

A power semiconductor device comprises a power switching element having two main electrodes and one control electrode, a metal electrode connected to one of main electrodes of the power switching element, and a protection circuit for controlling an operation of the power switching element so that a main current flowing between the main electrodes of the power switching element is detected and the main current is limited when the detected main current is determined to be an overcurrent. The protection circuit detects the main current flowing through the power switching element by detecting a voltage between predetermined two points of the metal electrode.

2 Claims, 2 Drawing Sheets

POWER SEMICONDUCTOR DEVICE

BACKGROUND OF THE INVENTION

1. Field of the Invention

This invention relates to a protection for overcurrent in a power semiconductor device using semiconductor switching elements such as IGBT.

2. Related Art

FIG. 4 shows a partial configuration of a power module in a prior art using a power semiconductor switching element such as IGBT. On/off operation of a switching element 31 such as IGBT is controlled by a gate drive circuit 33. In the conventional power module, a resistor 32 is disposed serially on common (emitter) side of the switching element 31 for overcurrent protection. Voltage drop across the resister 32 generated by a main current flowing through the switching element 31 is fed back to the gate driver circuit 33. Output voltage of the gate driver circuit 33 is kept constant, and therefore the voltage between the emitter and the gate substantially drops by the feedback voltage. Thus, the main current at a short-circuit of the switching element 31 is suppressed, and therefore performance at the short-circuit can be improved.

In the above described method, it needs to step down a voltage between the emitter and the gate by a several voltages to suppress the excess main current at the short-circuit. Therefore, a resistance value of the resistor 32 has normally to be set to few score milliohms. Such a few score milliohms of the resistor increases a loss generated in the switching element on the resistor 32 at normal operation. The loss may be too large to be ignored.

SUMMARY OF THE INVENTION

This invention is directed to solve the above problems and a purpose of which is to provide a power semiconductor device which can reduce the power loss of the power module at normal operation and achieve overcurrent protection with high precision.

A power semiconductor device according to the present invention comprises a power switching element having two main electrodes and one control electrode, a metal electrode connected to one of main electrodes of the power switching element, and a protection circuit for controlling an operation of the power switching element so that a main current flowing between the main electrodes of the power switching element is detected and the main current is limited when the detected main current is determined to be an overcurrent. The protection circuit detects the main current flowing through the power switching element by detecting a voltage between predetermined two points of the metal electrode. Thus using the metal electrode connected to the power switching element the main current flowing through the switching element is detected, and therefore it is possible to detect an overcurrent stably without variations and reduce the loss generated at the normal operation.

In the power semiconductor device, the metal electrode may be U-shaped. The U-shape reduces inductance of the metal electrode to suppress a noise generated by a change in current due to the switching operation. This can prevent the malfunction at the normal operation without a noise generated on the feedback voltage to the control circuit. Further a resistance of the metal electrode can be lessened to reduce the loss.

The power semiconductor device may comprise a power conversion section for converting a DC voltage into a predetermined three-phase AC voltage for driving a motor, the power conversion section including half-bridge circuits each provided for each phase and comprising the serial connected power switching elements. Then, in each phase, the metal electrode may be connected to one of main electrodes of the power switching element connected on the lower side of the half-bridge. This configuration enables an overcurrent in each phase to be detected.

According to the present invention, the power semiconductor device can be achieved which can reduce a loss generated at the switching operation and can detect an overcurrent stably.

DETAILED DESCRIPTION OF THE PREFERRED EMBODIMENTS

Preferred embodiments of a power semiconductor device according to the present invention are described below with reference to the accompanying figures.

<First Embodiment>

Figure 1:
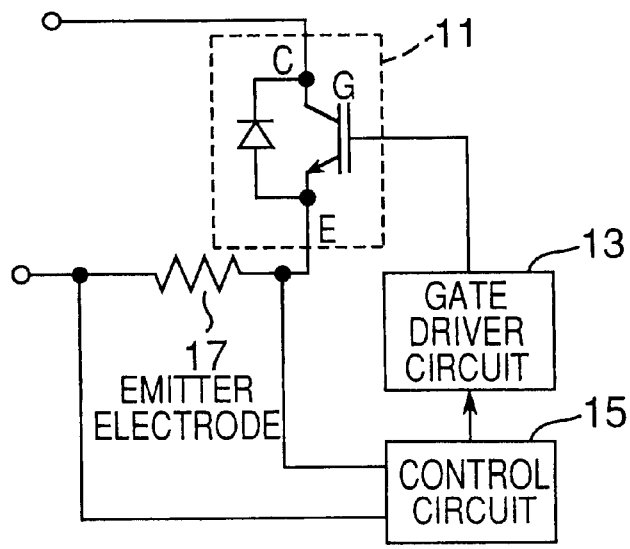
FIG. 1 shows a configuration for detecting overcurrent in a power module according to the present invention (First Embodiment).

FIG. 1 shows a configuration of a power semiconductor device (a power module) according to the present invention. The power module comprises an IGBT 11 which is a power semiconductor switching element, a gate driver circuit 13 for driving the IGBT 11, a control circuit for controlling the gate driver circuit 13. The control circuit 15 is implemented as an integrated circuit. The control circuit 15 normally controls the gate driver circuit 13 to control switching operation of the IGBT 11.

In the power module according to this embodiment, a metal electrode (emitter electrode) 17 is connected to an emitter terminal of the IGBT 11 which is a switching device. Especially, resistance of the metal electrode 17 is used as a resistor for detecting an overcurrent. A voltage across the emitter electrode 17 is fed back to the control circuit 15. The control circuit 15 detects a main current flowing between a collector and an emitter of the IGBT 11 based on a voltage across the emitter electrode 17. When the detected main current goes to a predetermined value, the control circuit determines that overcurrent occurs, and performs a function of protection for an overcurrent. More specifically, at overcurrent occurring, the control circuit outputs a control signal to the gate driver circuit 13 so as to limit a current flowing between the collector and the emitter of the IGBT 11 by a step-down of a voltage between the emitter and the gate of the IGBT 11.

Resistance value (Re) of the emitter electrode 17 used for overcurrent detection is expressed as follows.

$$R_e = V_{fe}/I_p \qquad (1)$$

$V_{fe}$ is a setting voltage for the control circuit 15, that is, a reference voltage for determining overcurrent detection. $I_p$ is a threshold current for overcurrent protection and is set to a reference current which is used for determining that a current flowing through the circuit is an overcurrent. Resistivity and cross section of a material of the emitter electrode 17 are determined so that the resistance $R_e$ of the emitter electrode 17 meets the above formula (1).

As described above, the power module of this embodiment uses the emitter electrode 17 of the switching element 11 as a means for detecting overcurrent. Since the emitter electrode 17 is a metal, the resistance is small (for example 1 mΩ) and stable without variations. Thus compared to the prior art in which a resistor is disposed on emitter side of the switching element 11, this embodiment can reduce a loss at the switching operation and detect an overcurrent stably.

<Second Embodiment>

Figure 2:
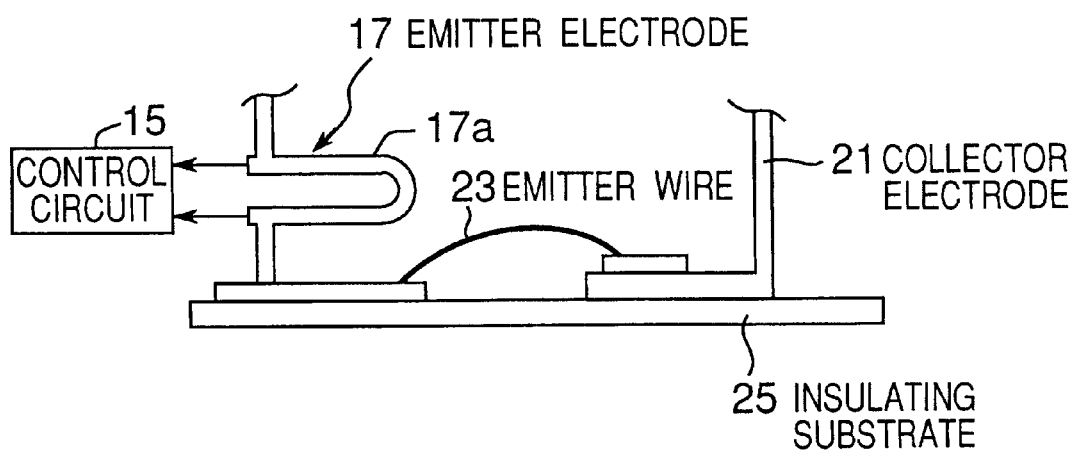
FIG. 2 shows a shape of the emitter electrode in the power module (Second Embodiment).

FIG. 2 shows a shape of the emitter electrode 17 which is used for overcurrent detection in the above described power module. As shown in the figure, a collector electrode 21 as well as the emitter electrode 17 is provided on an insulating substrate 25, and those electrodes 17, 21 are electrically coupled by an emitter wire 23.

AS shown in FIG. 2, the emitter electrode 17 has a U-shaped portion 17a. To use a resistance of the U-shaped portion 17a, both ends of the U-shaped portion 17a are connected to the control circuit 15.

The reason why the emitter electrode 17 has such a U-shaped portion 17a is described below.

To reduce the loss generated on switching operation as much as possible, it is preferable to reduce the resistance $R_e$, and thus the voltage $V_{fe}$ has to be reduced in considering the formula (1). If $V_{fe}$ is reduced to be small, the control circuit 15 tends to be affected by a noise in overcurrent detection. At that time, if inductance component of the emitter electrode 17 is large, an induced voltage is generated by the inductance component and a change in current at the switching operation, which may cause malfunction. Accordingly, the emitter electrode 17 is formed into U-shaped form, and thus a magnetic field generated on the electrode can be canceled to lessen the inductance of the emitter electrode 17. This prevents the malfunction from generating by a noise generated by a change in current at the switching operation.

As described above, the emitter electrode 17 is formed into U-shape, and thus the inductance of the emitter electrode 17 can be reduced. Thus, overcurrent detection can be achieved which can prevent the malfunction while reducing the loss at the switching operation.

<Third Embodiment>

Figure 3:
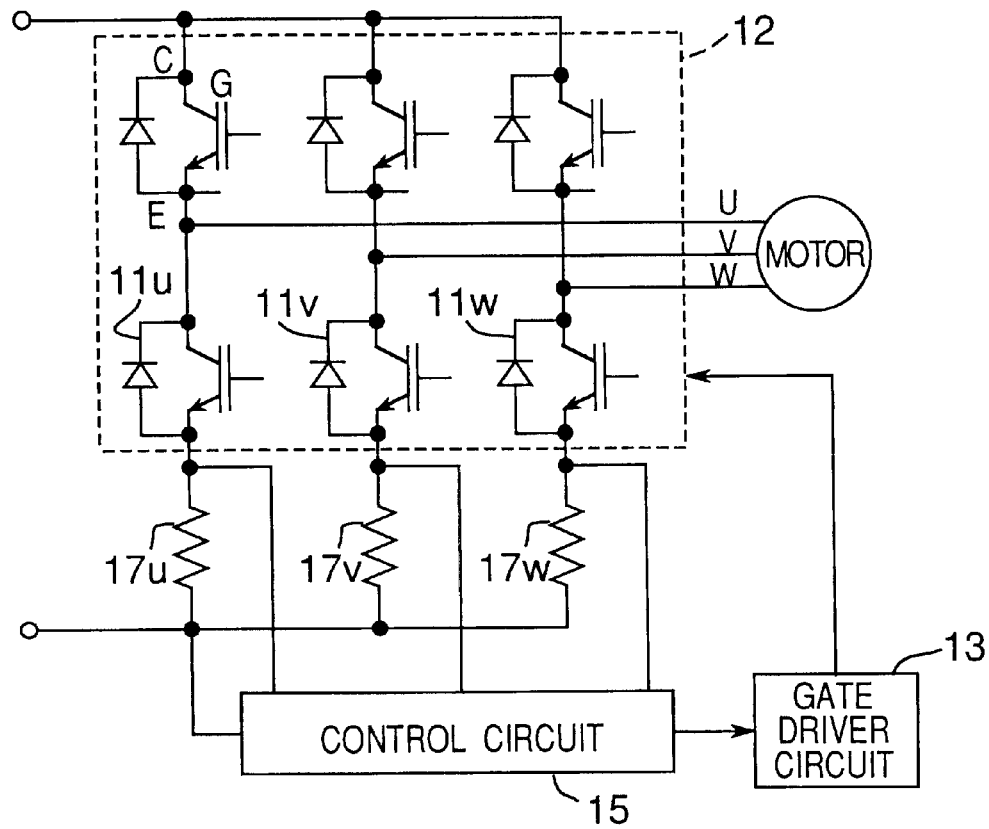
FIG. 3 shows location of emitter electrodes for detecting overcurrent in the three-phase inverter (Third Embodiment).
Figure 4:
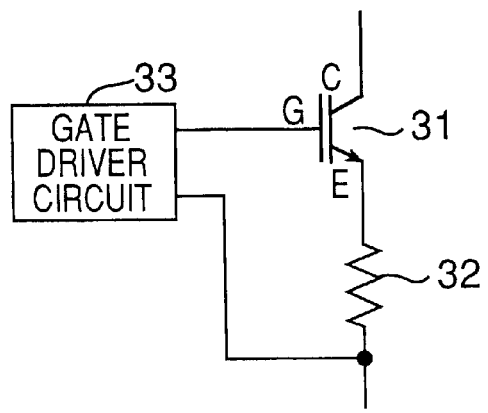
FIG. 4 shows a configuration for detecting overcurrent in a power module according to the prior art.

FIG. 3 shows a power module comprising a three-phase inverter using six IGBTs. The three-phase inverter 12 is a circuit for converting a DC voltage into a predetermined three-phase AC voltage for driving a motor. Each IGBT of the inverter 12 is driven by the gate driver circuit 13 which is controlled by the control circuit 15.

The inverter 12 includes half-bridge circuits each provided for each phase (U-, V-, W-phase) and comprising two IGBTs. The emitter electrodes 17u, 17v and 17w having a predetermined resistance (Re) are disposed on the emitter side of the IGBTs of a low arm, respectively. Voltages across the emitter electrodes 17u, 17v and 17w are fed back to the control circuit 15.

The configuration described above enables an overcurrent to be detected for each phase. Therefore, even if an overcurrent is generated by a short-circuit of the arm while the inverter 12 is acting, it is possible to stop the inverter 12 rapidly by stepping down voltages of gates of all IGBTs. Thus, the power module can be protected against a breakage due to the overcurrent.

Although the present invention has been described in connection with specified embodiments thereof, many other modifications, corrections and applications are apparent to those skilled in the art. Therefore, the present invention is not limited by the disclosure provided herein but limited only to the scope of the appended claims.

What is claimed is:

1. A power semiconductor device comprising:

a power switching element having two main electrodes and one control electrode;

a U-shaped metal electrode connected to one of main electrodes of the power switching element; and a protection circuit for controlling an operation of the power switching element so that a main current flowing between the main electrodes of the power switching element is detected and the main current is limited when the detected main current is determined to be an overcurrent;

wherein the protection circuit detects the main current flowing through the power switching element by detecting a voltage between two points at open ends of U-shaped portion of the metal electrode.

2. A power semiconductor device comprising:

a power conversion section for converting a DC voltage into a predetermined three-phase AC voltage for driving a motor, the power conversion section including half-bridge circuits for each phase and comprising serially connected power switching elements, each power switching element having two main electrodes and one control electrode;

a U-shaped metal electrode for each phase; and a protection circuit for controlling an operation of the power switching elements so that a main current flowing between the respective main electrodes of the power switching elements is detected and the main current is limited when the detected main current is determined to be an overcurrent;

wherein, in each phase, the metal electrode is connected to one of main electrodes of the power switching element of the lower side of the half bridge of each phase and the protection circuit detects the main current flowing through the power switching elements by detecting a voltage between two points at open ends of U-shaped portion of the respective metal electrodes.

* * * * *